United States Patent
Chang-Hasnain et al.

(10) Patent No.: US 10,361,539 B2
(45) Date of Patent: Jul. 23, 2019

(54) AIR-CAVITY DOMINANT VERTICAL CAVITY SURFACE EMITTING LASERS

(71) Applicant: THE REGENTS OF THE UNIVERSITY OF CALIFORNIA, Oakland, CA (US)

(72) Inventors: Connie Chang-Hasnain, Palo Alto, CA (US); Pengfei Qiao, Albany, CA (US); Kevin Taylor Cook, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/600,287

(22) Filed: May 19, 2017

(65) Prior Publication Data
US 2018/0301870 A1 Oct. 18, 2018

Related U.S. Application Data

(60) Provisional application No. 62/486,356, filed on Apr. 17, 2017.

(51) Int. Cl.
*H01S 5/183* (2006.01)
*H01S 5/187* (2006.01)
(Continued)

(52) U.S. Cl.
CPC .......... *H01S 5/18363* (2013.01); *H01S 5/026* (2013.01); *H01S 5/02296* (2013.01);
(Continued)

(58) Field of Classification Search
CPC .. H01S 5/18363; H01S 5/026; H01S 5/34313; H01S 5/02296; H01S 5/187; H01S 5/1096
See application file for complete search history.

(56) References Cited

U.S. PATENT DOCUMENTS 6,117,699 A * 9/2000 Lemoff ................... H01S 5/423
438/35
8,059,690 B2 11/2011 Chang-Hasnain
(Continued)

FOREIGN PATENT DOCUMENTS

JP 2006294811 A 10/2006
KR 100794673 B1 6/2007

OTHER PUBLICATIONS

Sugihwo, F. et al., "Simultaneous optimization of membrane reflectance and tuning voltage for tunable vertical cavity lasers", Appl. Phys. Lett. 72, 10 (1998), Jan. 5, 1998, pp. 10-12.
(Continued)

*Primary Examiner* — Yuanda Zhang
(74) *Attorney, Agent, or Firm* — O'Banion & Ritchey LLP; John P. O'Banion

(57) ABSTRACT

Vertical-cavity surface-emitting laser (VCSEL) structures are described which enable their use as widely wavelength-swept coherent light sources and multiple-wavelength VCSEL arrays. Three general configurations are described: (a) a semiconductor-cavity-dominant (SCD) with high reflection at the semiconductor-air interface, (b) an extended-cavity (EC) design in which reflections at the semiconductor-air interface is reduced to insignificance compared to the SCD design with a refractive index-matched layer (i.e., AR layer) so the entire structure resonates as one cavity, and (c) an air-cavity-dominant (ACD) design which facilitates a larger field confinement in the air gap, and the increased field confinement causes the air gap to be the dominant cavity.

20 Claims, 14 Drawing Sheets

(51) Int. Cl.
*H01S 5/022* (2006.01)
*H01S 5/10* (2006.01)
*H01S 5/026* (2006.01)
*H01S 5/14* (2006.01)
H01S 5/343 (2006.01)

(52) U.S. Cl.
CPC ............ *H01S 5/1096* (2013.01); *H01S 5/142* (2013.01); *H01S 5/187* (2013.01); *H01S 5/18366* (2013.01); *H01S 5/18311* (2013.01); *H01S 5/18358* (2013.01); *H01S 5/18361* (2013.01); *H01S 5/34313* (2013.01)

(56) References Cited

U.S. PATENT DOCUMENTS

| | | | |
|---|---|---|---|
| 8,189,643 | B2 | 5/2012 | Chang-Hasnain |
| 8,442,374 | B2 | 5/2013 | Chang-Hasnain |
| 8,488,646 | B2 | 7/2013 | Chang-Hasnain |
| 8,526,471 | B2 | 9/2013 | Chang-Hasnain |
| 8,755,118 | B2 | 6/2014 | Chang-Hasnain |
| 2004/0013157 | A1 | 1/2004 | Deng |
| 2008/0144685 | A1* | 6/2008 | Tansu .................... B82Y 20/00 372/45.011 |
| 2011/0280269 | A1 | 11/2011 | Chang-Hasnain |
| 2012/0128019 | A1 | 5/2012 | Chang-Hasnain |
| 2014/0353530 | A1 | 12/2014 | Chang-Hasnain |
| 2014/0353583 | A1 | 12/2014 | Chang-Hasnain |
| 2015/0010034 | A1 | 1/2015 | Chang-Hasnain |
| 2015/0171597 | A1 | 6/2015 | Yvind |
| 2015/0286006 | A1 | 10/2015 | Chang-Hasnain |
| 2015/0288146 | A1 | 10/2015 | Chang-Hasnain |
| 2016/0056613 | A1 | 2/2016 | Makino |
| 2017/0023807 | A1 | 1/2017 | Chang-Hasnain |

OTHER PUBLICATIONS

Sugihwo, Fred et al., "Low threshold continuously tunable vertical-cavity surface-emitting lasers with 19.1 nm wavelenght range", Appl. Phys. Lett. 70, 547 (1997), Feb. 3, 1997, pp. 547-549.

Sugihwo, Fredy et al., "Micromachined Widely Tunable Vertical Cavity Laser Diodes", Journal of Microelectromechanical Systems, vol. 7, No. 1, Mar. 1998, pp. 48-55.

ISA/KR, Korean Intellectual Property Office (KIPO), International Search Report and Written Opinion dated Apr. 4, 2019, related PCT international application No. PCT/US2018/027109, pp. 1-9, claims searched, pp. 10-12.

* cited by examiner

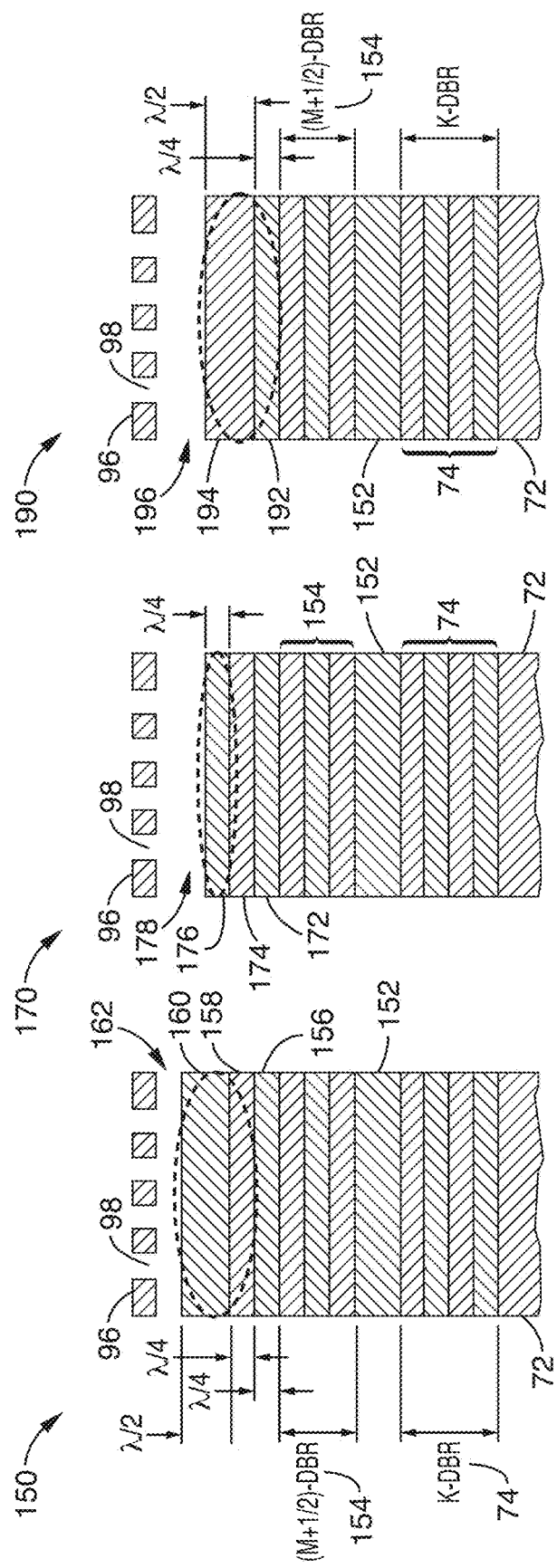

US 10,361,539 B2

AIR-CAVITY DOMINANT VERTICAL CAVITY SURFACE EMITTING LASERS

CROSS-REFERENCE TO RELATED APPLICATIONS

This application claims priority to, and the benefit of, U.S. provisional patent application Ser. No. 62/486,356 filed on Apr. 17, 2017, incorporated herein by reference in its entirety.

STATEMENT REGARDING FEDERALLY SPONSORED RESEARCH OR DEVELOPMENT

This invention was made with government support under Grant Number HR0011-15-C-0057 awarded by the Defense Advanced Research Projects Agency (DARPA). The government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to vertical-cavity surface-emitting lasers (VCSELs), and more particularly to a wavelength-swept high-contrast grating (HCG) vertical-cavity surface-emitting laser (VCSEL).

2. Background Discussion

Vertical-cavity surface-emitting lasers (VCSELs) have many applications, including potential use in optical coherence tomography (OCT) and optical fiber communications. Both fields are rapidly growing and there is a need for widely-tunable VCSELs than can be used as the wavelength-swept sources in OCT. One technique that could increase the tuning range of a VCSEL would be to use an engineered semiconductor-air-coupling (SAC) interface. However, a concern is that engineering the SAC region in a tunable VCSEL would cause the laser threshold to sharply increase. Therefore, researchers have not pursued that approach. Instead, researchers have applied an anti-reflection (AR) layer at the semiconductor-air interface or modified the layer orders in the top distributed Bragg reflector (DBR) to extend the tuning range. However, the AR layer has to be one quarter-lambda thick with refractive index close to the square root of the product of the semiconductor refractive index and the refractive index of air.

Accordingly a need exists for VCSEL designs which provide a wide tuning range and a high sweep speed. The present disclosure provides a VCSEL apparatus and method which overcomes shortcomings of prior VCSEL structures and provides additional benefits.

BRIEF SUMMARY

A layer structure is described for vertical-cavity surface-emitting lasers (VCSELs) that enable their use as widely wavelength-swept coherent light sources and multiple-wavelength VCSEL arrays.

In one embodiment, a VCSEL according to the present disclosure comprises a semiconductor portion and a top mirror with an air gap in-between. The air gap is referred to as an "air cavity" in this disclosure. The semiconductor portion comprises (listed from top to bottom) a novel semiconductor-air coupling (SAC) region, a top distributed Bragg reflector (DBR), a semiconductor cavity containing an active region, a bottom DBR, and finally a substrate. With the novel SAC region design, the emission wavelength of the VCSEL becomes strongly dependent on the air cavity thickness and/or the reflection phase of the top mirror. A much wider wavelength tuning range can thus be obtained by actively adjusting the thickness of the air gap or the reflection phase of the top mirror. A monolithic array with a large wavelength span can be obtained by changing the top reflector phase.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

FIG. 3A through FIG. 3C are schematic cutaway views of VCSELs according to alternate embodiments of the present disclosure.

DETAILED DESCRIPTION

A. Design

Figure 1:
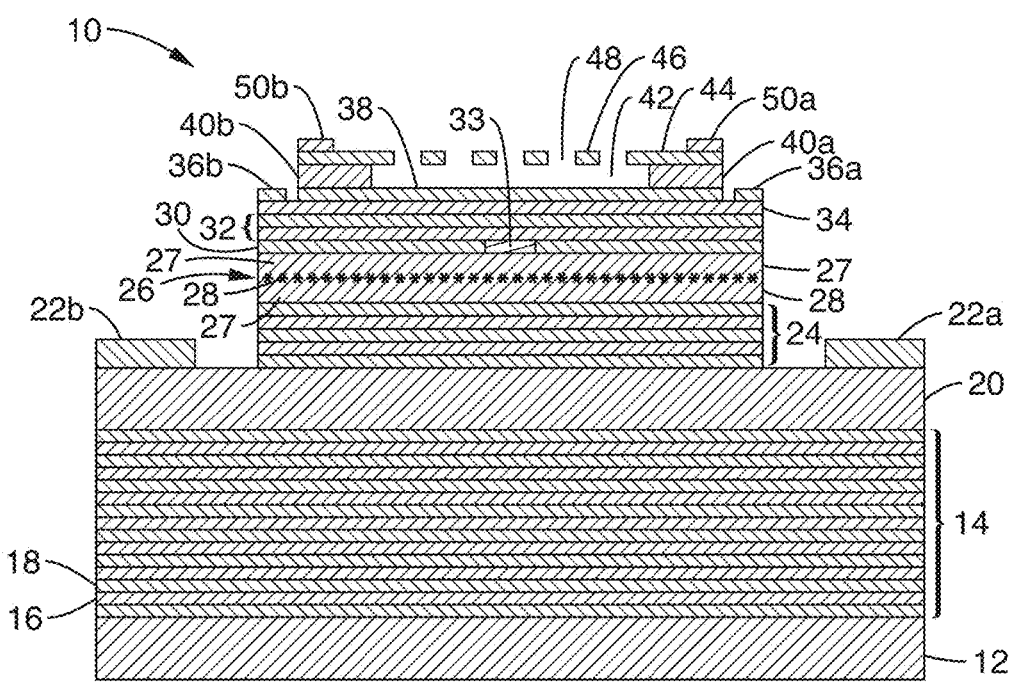
FIG. 1 is a schematic cutaway view of a VCSEL structure according to an embodiment of the present disclosure.

FIG. 1 illustrates an example embodiment 10 of a wavelength-swept high-contrast grating (HCG) vertical-cavity surface-emitting laser (VCSEL) layer structure. In this embodiment, the HCG 46 comprises a single layer of periodic subwavelength structure comprising a high-refractive index material (e.g., AlGaAs or Si) surrounded entirely by low-refractive index material (e.g., air or oxide) 42, 48. A bottom n-doped DBR (n-DBR) 14 comprising a plurality of alternating layers 16, 18, of different refractive index (e.g., preferably about 30 to 40 pairs of $Al_{0.9}Ga_{0.1}As/GaAs$) with center wavelength in this example case at 1060 nm, is shown over a substrate 12.

An n+ layer 20 is over n-DBR section 14. A first contact (n-contact) shown with sections 22a and 22b are shown over a portion of the n+ layer 20. Another reflective section 24 is shown comprising multiple layers of an n-DBR is on top of n+ layer 20 and interior to n-contact 22a, 22b.

The nominally undoped, one-lambda cavity 26 is shown with active region 27 through which are multiple quantum wells 28, such as comprising 3 to 6 InGaAs/GaAsP quantum wells (QWs). The oxidation layer 30 typically consists of high-Al content AlGaAs compounds, e.g., $Al_{0.98}Ga_{0.02}As$. Through wet thermal oxidation, the oxidation layer turns into the low-refractive-index $Al_xO_y$ compound, which is stable and robust. With the time control, the center region 33 remains unoxidized, thus providing index guiding and a current aperture. Above the cavity, there is a multiple layer p-DBR 32, for example comprising 0-2 pairs of $Al_{0.12}Ga_{0.88}As/Al_{0.9}Ga_{0.1}As$ p-doped top DBR. Over the p-DBR 32 is a p+ layer 34, which is highly conductive and suitable for deposition of metal contacts. A second contact with sections 36a, 36b is shown over p-DBR 32. A thermal oxidation layer 38, such as 30-nm $Al_{0.98}Ga_{0.02}As$, is over p-DBR 32 within the region bounded by contact 36a, 36b, is counted as part of the first low-index quarter-lambda layer. In between the HCG layer 46 and the top DBR is an undoped GaAs sacrificial layer, which was selectively removed, such as via wet etching or other removal mechanism to forms air cavity 42 surrounded by remaining sacrificial layer sections 40a, 40b.

The HCG layer 46 is fabricated as part of a micro-electro-mechanical structure (MEMS) having first and second contacts 50a, 50b. The HCG layer is freely suspended above the remainder of the semiconductor layers, so that by applying a voltage on contacts 50a, 50b, across the MEMS structure, the air cavity thickness is changed and the VCSEL wavelength is tuned. The tuning of the air cavity thickness is not restricted to the electrostatic control of MEMS. Alternative tuning mechanisms include electro-thermal actuation and mechanical resonant tuning.

This disclosure focuses on discussing the layers above the semiconductor cavity to show that a tunable VCSEL structure can be seen as having two coupled cavities that are optically coupled in the longitudinal direction: a semiconductor cavity with active region and an air cavity. The conventional design had the semiconductor cavity being the dominant one in determining the Fabry-Perot mode, which is the lasing wavelength. This disclosure shows how the semiconductor-air coupling region can be designed such that the air cavity dominates and determines the Fabry-Perot mode; whereby the continuous tuning range can be greatly increased.

In a first embodiment, a conventional semiconductor-cavity-dominant (SCD) form of structure is used. Here, a high reflection is provided at the semiconductor-air interface, which suppresses the field penetration from semiconductor into air. This design resembles a conventional VCSEL in which the optical mode is confined in the semiconductor cavity.

In a second embodiment, an extended-cavity (EC) form of design is used. In this embodiment, the reflection at the semiconductor-air interface is reduced to an insignificant value compared to the SCD design with a refractive index-matched layer (i.e., AR layer) such that the entire structure resonates as one cavity. In other words, the original semiconductor cavity "extends" into the air cavity.

In a third embodiment, an entirely new design is described which we refer to as the air-cavity-dominant (ACD) design. This ACD design facilitates a larger field confinement in the air gap, and the increased field confinement causes the air gap to be the dominant cavity.

The only difference required for the three configurations is the SAC region, with engineered thickness and refractive index.

All three configurations have a hybrid top mirror, which includes an HCG, an air gap, the SAC region, and a top DBR region, located above the semiconductor cavity. The semiconductor cavity typically contains one or more QWs as the active region, as shown in FIG. 1. The QWs comprise a direct-bandgap semiconductor with the lowest bandgap energy of the entire epitaxy such that the rest of the entire epitaxy does not significantly absorb the emission from the QWs.

The semiconductor cavity typically comprises a material with a refractive index that is lower than the QW refractive index but higher than at least the low-index layer of the DBR pair. In one such embodiment, the QWs may comprise InGaAs, the semiconductor cavity may comprise GaAs or AlGaAs with low Aluminum concentration, and the DBR may comprise $Al_xGa_{1-x}As/Al_yGa_{1-y}As$ or $Al_xGa_{1-x}As/GaAs$ pairs. In this case, the semiconductor cavity thickness may be one-lambda or one-lambda plus a non-negative integer multiple of half-lambda. The placement of QWs in the semiconductor cavity and the design of the QWs would follow typical VCSEL design.

Figures 2A, 2B, 2C:
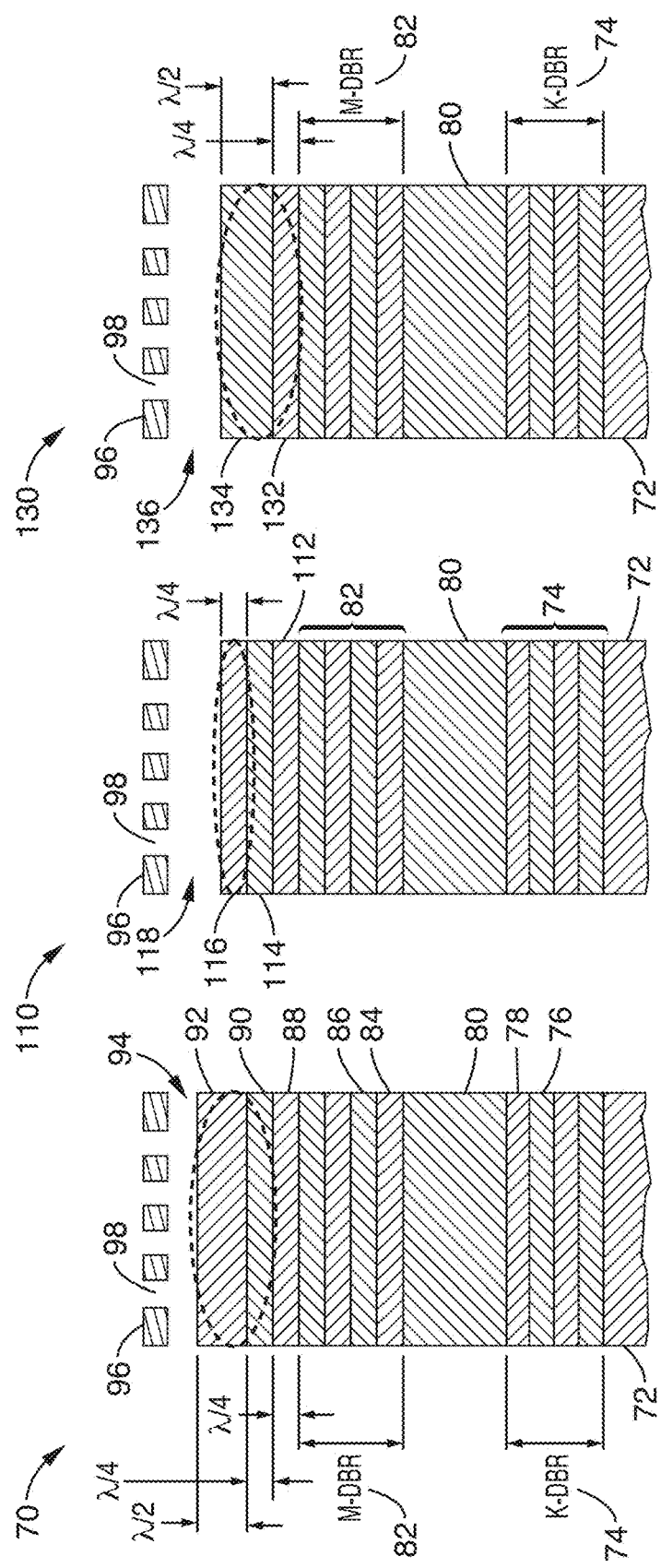
FIG. 2A through FIG. 2C are schematic cutaway views of VCSELs according to embodiments of the present disclosure.

FIG. 2A through FIG. 2C illustrate example embodiments 70, 110, 130 of the top DBR, above the laser cavity, which may comprise M pairs of alternating quarter-lambda low-refractive index layer and quarter lambda high-refractive index layer, with the quarter-lambda low-refractive index layer just above the cavity region. Throughout this disclosure, M is any non-negative integer (0, 1, 2, . . . ). It will be noted that below cavity 80 is only shown for completeness of the VCSEL structure, the bottom DBRs on substrate are typical for VCSELs.

Each of the figures show a substrate 72 over which is a K-DBR region 74 with alternating refractive index layers of material 76, 78, above which is a high refractive index material forming a one lambda cavity 80, and above which is an M-DBR 82 with alternating layers of material 84, 86.

In FIG. 2A an SCD design is shown with the M pairs of top DBR followed by a quarter-lambda low-refractive index layer 88 which is referred to as "Low 1". The refractive index of the "Low 1" layer may or may not be the same as the lower refractive index used in the DBR. On top of the "Low 1" layer is the SAC region (dashed oval), which comprises a high-refractive index layer ("High 1") 90 and a window layer (WL) 92. The HCG is shown with high refractive elements 96 of the grating interspersed with low refractive elements 98 (e.g., air), over a low refractive index layer 94 (e.g., air).

The refractive index of the "High 1" layer may or may not be the same as the higher refractive index used in the DBR. The thickness of the "High 1" layer should be an odd integer multiple of quarter-lambda. The thickness of the WL can be zero or a positive integer multiple of half-lambda. Here, the refractive index of the WL may be any value, such as 1.0 to 7.5.

It should be mentioned that one alternative SCD configuration is when the WL is positioned directly on top of the semiconductor cavity without the High1/Low1 or any DBR pairs (M=0).

In FIG. 2B an EC design is shown with the M-DBR region 82, above which is a quarter wavelength Low region 112, then a quarter wavelength High region 114. Then above these layers is a SAC region (dashed oval) comprising an AR layer 116 whose index is between the higher refractive index used in the DBR 96 and the refractive index of air 98, 118. The thickness of the AR layer is one quarter-lambda. To be a true AR layer, the AR refractive index should be the geometric mean of the refractive indices of the high-refractive index DBR layer and air. Here the choice of AR refractive index may deviate somewhat from the optimum value as long as the reflection at the semiconductor-air interface is noticeably suppressed.

In FIG. 2C the new ACD design is shown with the same layers as the above up through the M-DBR layers 82. Above the M-DBR is the SAC region (dashed oval) directly on top of the high-refractive index layer from top DBR. This SAC region comprises a quarter-lambda "Low 1" layer 132 and a WL layer 134, with thicknesses and choices of materials defined the same as previously in this disclosure for the SCD design. The HCG is shown with high refractive elements 96 of the grating interspersed with low refractive elements 98 (e.g., air), over a low refractive index layer 136 (e.g., air).

The most important distinction between ACD and SCD is that the SAC region includes a quarter-lambda "Low 1" layer but no "High 1" layer. It should be noted that one alternative ACD configuration is when the SAC region is positioned directly on top of the semiconductor cavity without any DBR pairs (M=0).

It should be noted that for practical design, the "High", "Low", "High 1", "Low 1", semiconductor cavity, WL, DBR and HCG may comprise multiple layers to have equivalent behavior. For example, the "High" layer in the DBR may comprise a high-refractive index layer (e.g., GaAs) and a grading layer (e.g., $Al_xGaAs$ with x: 0.1→0.9), which combines to be an equivalent quarter-lambda high-refractive index layer. In another example, an SCD design, has a WL of zero thickness, and a "High 1" layer comprising an $Al_xGa_{1-x}As$ graded layer and two $Al_{0.6}Ga_{0.4}As$ layers, which combine to be one quarter-lambda. In addition, the multiple DBR pairs may comprise pairs with different material combinations. The semiconductor cavity typically comprises cavity layers, quantum wells and barriers and grading layers. In the disclosed ACD design, the WL comprises an $Al_xGa_{1-x}As$ graded layer, a GaAs layer, and an InGaP layer, which all combine to be one half-lambda thickness.

If the cavity region material is chosen to have a higher bandgap energy (lower refractive index) compared to the rest of the epitaxy, e.g., high-Al content InGaAlAs for InGaAs QWs with 1.3 µm or 1.55 µm emission, then the cavity region would be an integer multiple of half-lambda.

FIG. 3A through FIG. 3C illustrates example embodiments 150, 170, 190 of all three designs with the High and Low index materials reversed from that seen in FIG. 2A through FIG. 2C. In particular, for each of these embodiments a substrate 72 is shown, above which is a K-DBR region 74 comprising Low refractive layer, followed by High refractive layer and so forth, over which is a Low refractive index cavity 152, followed by an M+½ DBR region 154 comprising a High, Low, and High refractive index layers.

In this case, the DBR above the semiconductor cavity comprises (M+½) pairs (alternating quarter-lambda high-refractive index layer and quarter-lambda low-refractive index layer) with the quarter-lambda high-refractive index layer just above the semiconductor cavity.

The remaining layers above the top DBR for the SCD, EC, and ACD cases in FIG. 3A through FIG. 3C are the same as the corresponding SCD, EC, and ACD cases with high-index cavities shown in FIG. 2A through FIG. 2C.

In particular, the SCD design of FIG. 3A, has a "Low 1" layer 156 above the M+½ DBR, above which is a SAC region (dashed oval). The SAC region comprises a quarter wavelength High 1 layer 158, over which is a window layer (WL) 160. The HCG can be the same as in the other embodiments with high refractive elements 96 of the grating interspersed with low refractive elements 98 (e.g., air), over a low refractive index layer 162 (e.g., air).

More specifically, for the EC design of FIG. 3B, there is a "Low" layer 172 above the M+½ DBR, above which is a quarter wavelength "High" layer 174, above which is a SAC region (dashed oval). The SAC region comprises an AR layer 176. The HCG can be the same as in the other embodiments with high refractive elements 96 of the grating interspersed with low refractive elements 98 (e.g., air), over a low refractive index layer 178 (e.g., air).

More specifically, for the ACD design of FIG. 3C, there is the SAC region (dashed oval) above the M+½ DBR. The SAC region comprises a "Low1" layer 192 above which is a Window layer (WL) 194. The HCG can be the same as in the other embodiments with high refractive elements 96 of the grating interspersed with low refractive elements 98 (e.g., air), over a low refractive index layer 196 (e.g., air).

In all six cases described above, the top DBR region may comprise a small number of pairs or zero pairs. It should be noted that each of the DBR layers can be an odd integer multiple of quarter-lambda thickness. Also, the topmost layer in the hybrid top mirror may be a HCG, a 2D high contrast metastructure (HCM), a DBR comprising semiconductor or dielectric materials, or a combination of a DBR, a phase matching layer, and metal. The HCGs can be of transverse-electric (TE) type or transverse-magnetic (TM) type. The definitions and typical design parameters for TE-HCGs and TM-HCGs can be found in the literature.

It should be noted that the new ACD design differs significantly from any air-coupled cavity previously developed in both definition and construct.

It will be appreciated that the schematics in FIG. 2A through FIG. 2C, and FIG. 3A through FIG. 3C, are mainly provided for illustration purposes of the SAC and semiconductor cavity design, and therefore the QWs, oxidation layer, tunnel junction, and so forth are not shown. For practical design based on different material systems, a proton implant layer, instead of the oxidation layer, can be incorporated into the semiconductor cavity for current confinement. Therefore, the refractive index of the cavity effectively may not be the same as either the higher or the lower refractive index in the DBR. Furthermore, buried tunnel junctions can be used next to the semiconductor cavity for the reduction of free-carrier absorption and electrical resistance in the p-type materials. In this case, the type of doping can be different for the top and bottom DBRs in FIG. 1.

B. Results

Figure 4:
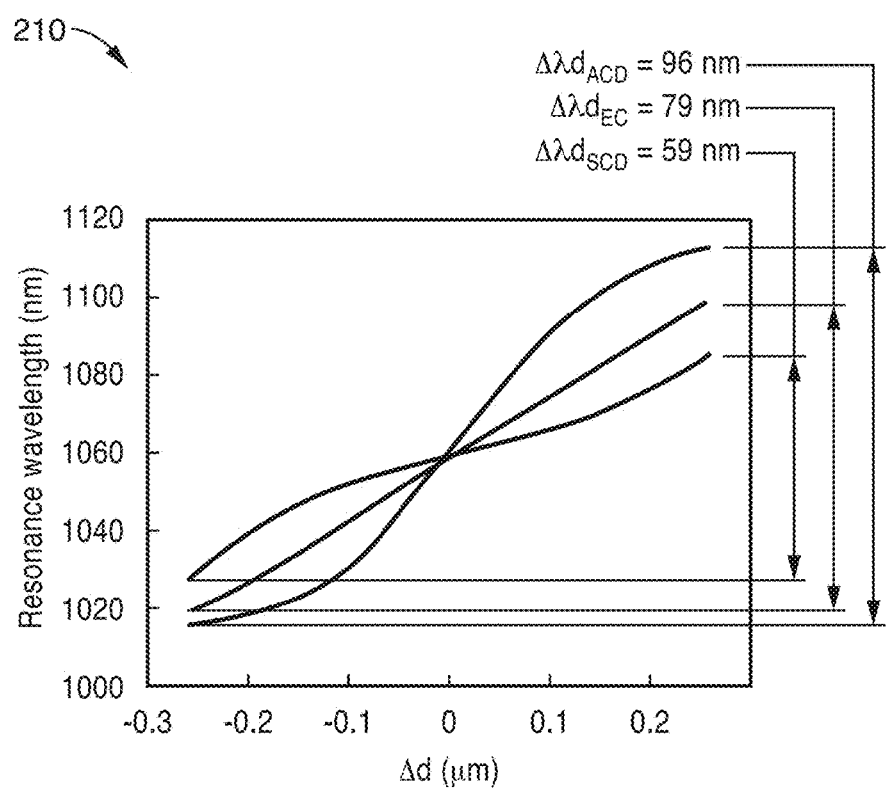
FIG. 4 is a plot of calculated tuning curves utilized according to an embodiment of the present disclosure.

FIG. 4 illustrates an example embodiment 210 of calculated tuning curves, that is, the VCSEL resonance wavelength as a function of the change of the air gap thickness (Δd) for SCD, EC and ACD designs with a one-lambda cavity (as shown in FIG. 2A through FIG. 2C), using the transfer-matrix method and the complex reflection coefficient from the HCG. All three cases comprise the same full layer structures of practical wavelength-swept VCSELs centered at 1060 nm, except for being different only in their coupling regions. The "High 1" layer for SCD comprises an $Al_xGa_{1-x}As$ graded layer, a GaAs contact and an InGaP etch stop, combined to be one quarter-lambda thick. The WL for SCD is of zero thickness in this case. The EC design uses the same high-refractive index layer as SCD, followed by a one quarter-lambda $Al_2O_3$ layer. The WL of this ACD design comprises an $Al_xGa_{1-x}As$ graded layer, a GaAs contact, and an InGaP etch stop, which are same as the "High 1" layer in SCD. The only difference is the equivalent thickness being one half-lambda, instead of one quarter-lambda. Therefore, comparing SCD and ACD, the only difference is the thickness of the composite $Al_xGa_{1-x}As$+GaAs+InGaP layer. Quite surprisingly, the tuning range increases from 59 nm (SCD) to 96 nm (ACD) by a simple change in thickness.

It should be noted that the shapes of the tuning curves for SCD, EC, and ACD are significantly different, as depicted in FIG. 4. Here, the air gap thickness is referred to as d, and the change of the air gap thickness is referred to as Δd. Hence, one can categorize the design by observing the shape of the tuning curve. For EC, the tuning curve is a straight line (i.e., the resonance wavelength is linear with Δd). For ACD, the tuning curve is an S-shape. For SCD, the tuning curve is a mirrored S-shape.

Conventionally, the VCSEL threshold material gain (proportional to threshold current) has been expressed to be proportional to the overlap integral of optical field intensity with the QWs, known as the longitudinal energy confinement factor ($\Gamma_z$), which can be written for non-dispersive or weakly-dispersive materials as:

$$\Gamma_z = \frac{\int_{L_a} n_a^2 |E(z)|^2 dz}{\int_L n^2(z) |E(z)|^2 dz} \quad (1)$$

where z is the direction of epitaxy (vertical direction in FIG. 1), $n_a$ and n(z) are the active region and z-dependent effective indices, respectively. Here, $L_a$ signifies the integration range for calculating energies in the active region, and L is the integration range for the entire device for conventional VCSEL modeling. However, there was a misconception in the past literature that the air gap thickness was included in L for wavelength-swept VCSELs.

Figure 5A:
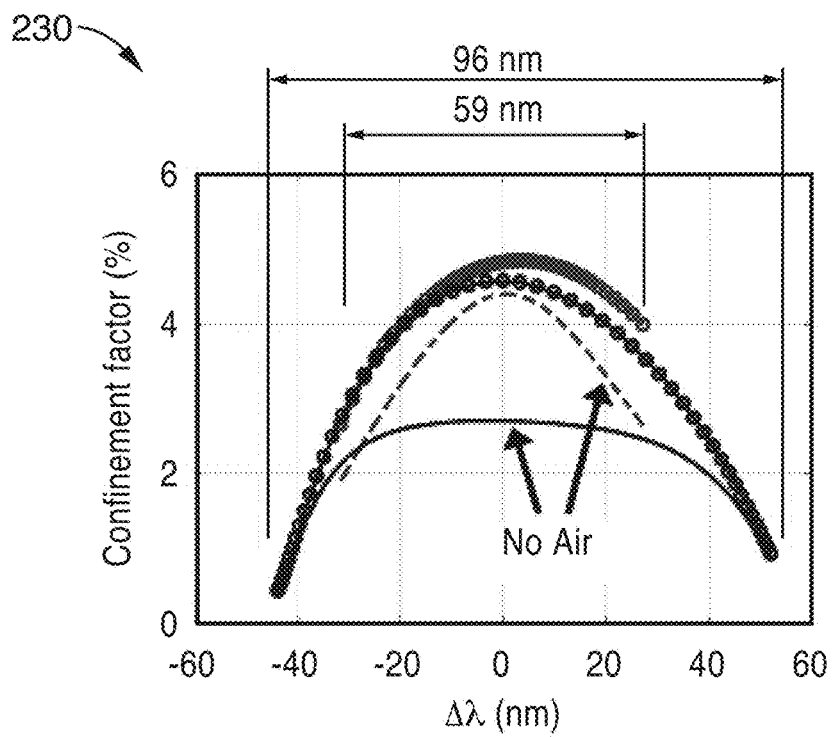
FIG. 5A and FIG. 5B are plots of confinement factor and threshold material gain determined according to an embodiment of the present disclosure.
Figure 5B:
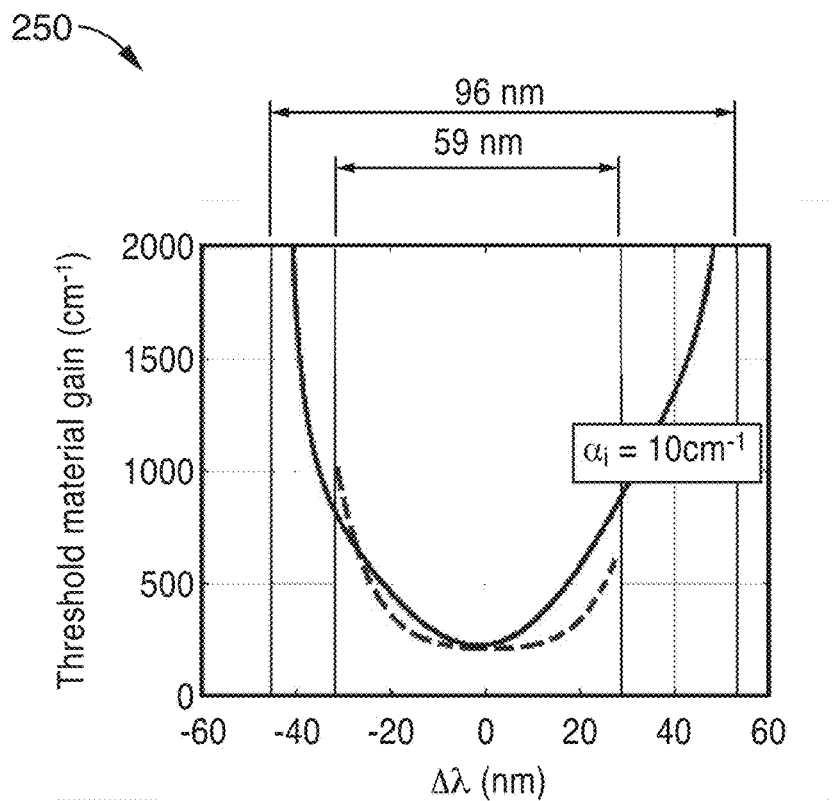

FIG. 5A and FIG. 5B depict plots of confinement factor 230, and threshold material gain 250, respectively. In FIG. 5A the curves shows the $\Gamma_z$'s for the SCD and ACD designs calculated including (solid lines) and excluding the air gaps (circles), respectively. When including the air gap, the $\Gamma_z$'s reveal a large difference between the two designs due to the different coupling strength of the semiconductor cavity with the air cavity. In this case, the energy confinement drops from 4.4% for the SCD design to about 2.7% with the ACD design. As the majority of literature considers it is correct to include the air gap in the calculation, the ACD design could be considered undesirable with a major compromise in laser thresholds. However, if excluding the air gap in the calculation, both designs have similar peak value around 5%, indicating good QW alignment without significant compromise.

We conclude here that an unambiguous way to calculate threshold material gain is to use the following equation, regardless of the chosen longitudinal span of devices. We define the round-trip gain at resonance as $$G_{RT}(g) = -\ln\left(\frac{1}{|r_{top}(\lambda)|^2 |r_{cavity+bottom}(\lambda g)|^2}\right)\bigg|_{\lambda=\lambda_r} \quad (2)$$

where g is the material gain added as the imaginary part of the active region index. The threshold material gain is found when the round-trip gain satisfies $G_{RT}(g_{th})=0$. Here, the intrinsic loss is assumed to be 10 $cm^{-1}$.

In FIG. 5B the threshold material gain curves as functions of the tuning wavelength for SCD and ACD designs are shown. The threshold gain is similar for both designs at their tuning centers, but the tuning range is wider for ACD than SCD, as indicated by the solid line in the 96 nm region and the dashed line in the 59 nm region. However, the increase of threshold away from the center wavelength is also sharper for ACD. We found that the tuning range increased from 59 nm (SCD) to 96 nm (ACD) while the difference in threshold gain at the tuning center is only different by 6% between SCD and ACD.

The tuning range of tunable MEMS-VCSELs has been primarily determined by the Fabry-Perot mode spacing, known as free spectral range (FSR). From the Fabry-Perot (FP) resonance condition, the resonance wavelength λ is related to the air gap thickness d by $\lambda_m=2(d+L_{eff})/m$. Here, $L_{eff}$ is the effective cavity length, and m is the FP mode number; whereby $L_{eff}$ is equal to the sum of the physical length of the semiconductor cavity and the penetration depths into the bottom and top mirrors. A larger index contrast between the DBR layers results in a shorter penetration depth at the center wavelength of the DBR band because the energy falls faster with each interface. In addition, the number of DBR pairs required for a VCSEL can be significantly reduced. For a GaAs-based VCSEL, the effective cavity length can be approximately 1 to 2 μm, resulting in a very large FSR. Small thickness variation in the DBRs or the semiconductor cavity changes the FP wavelength and, thus, the laser wavelength. Due to the large FSR, a large wavelength change can be achieved without hopping between different FP modes.

FIG. 6A through FIG. 6C, FIG. 7A through FIG. 7C, and FIG. 8A through FIG. 8C, depict Finite-difference time-domain (FDTD) simulations on the full tunable VCSEL structures to verify the tuning curves, where TM-polarized HCGs are used. Typical TM-HCGs centered at 1060 nm have periods ranging from 480 nm to 505 nm, and duty cycles ranging from 69% to 73%. Here, the cavity regions for all cases are one-lambda thick with indices of 3.483. Two pairs of top DBR and 38 pairs of bottom DBRs are used.

The figures compare SCD, EC, and ACD designs using the structures in FIG. 2A through FIG. 2C, with all "High" layers having an index of 3.483, and all "Low" layers having an index of 2.988. The WL thickness is zero for SCD, and half-lambda for ACD. Therefore the only difference between SCD and ACD in this case is the thickness (one quarter-lambda vs. one half-lambda) of the topmost high-index layer before air gap. Two sets of resonance lines were further identified from the asymptotic lines of the tuning curves from FIG. 6A through FIG. 6C.

Figure 6A:
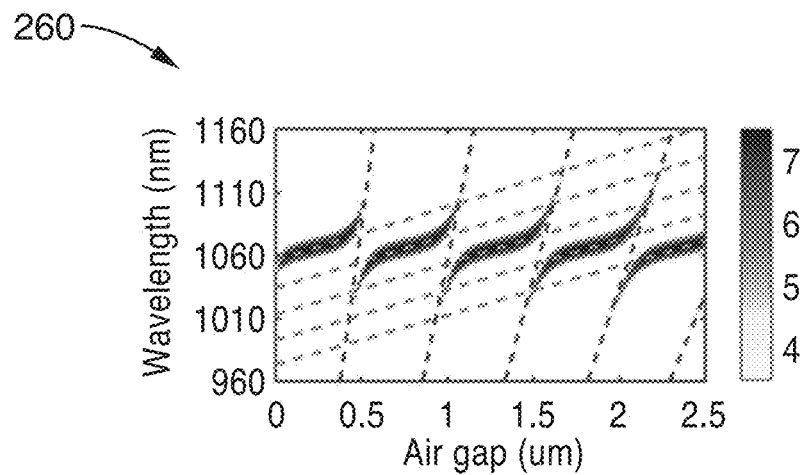
FIG. 6A through FIG. 6C are plots of tuning curves for SCD, EC and ACD VCSELs according to a first configuration of the present disclosure.

In particular, in the results 260 seen in FIG. 6A, the more vertical dashed lines for SCD correspond to $L_{eff}$=0.58 µm and m=approximately 2 to 6. The more horizontal dashed lines for SCD correspond to $L_{eff}$=22.67 µm and m=approximately 43 to 47. The more vertical dashed lines indicate air-cavity resonance with small field penetration depth into the semiconductor. The more horizontal dashed lines indicate semiconductor-cavity resonance, thus the field penetrates much deeper into the semiconductor region.

Figure 6B:
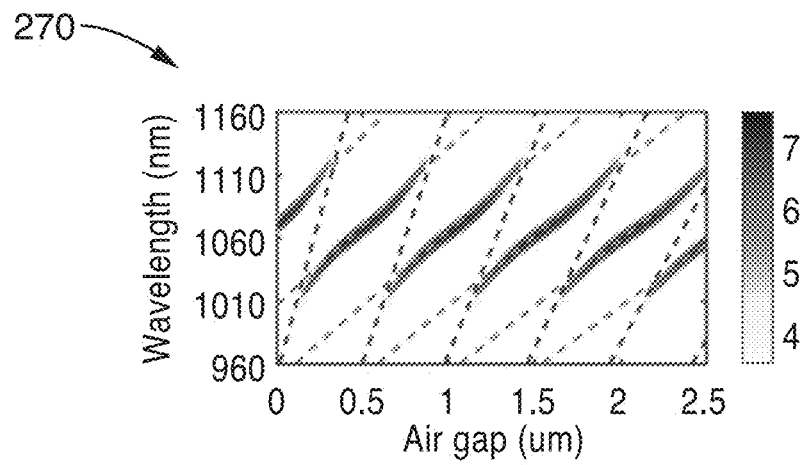

Similarly, in the results 270 seen in FIG. 6B, the more vertical dashed lines for EC correspond to $L_{eff}$=1.9 µm and m=approximately 4 to 8. The more horizontal dashed lines for EC correspond to $L_{eff}$=6.96 µm and m=approximately 13 to 18.

Figure 6C:
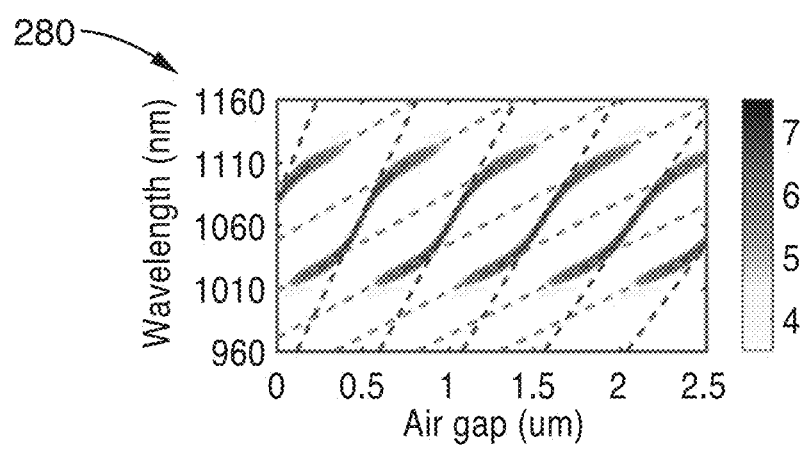

As shown in the results 280 seen in FIG. 6C, the more vertical dashed lines for ACD correspond to $L_{eff}$=3.24 µm and m=approximately 6 to 11. The more horizontal dashed lines for ACD correspond to $L_{eff}$=13.1 µm and m=approximately 24 to 30. The extracted tuning ranges for the SCD, EC, and ACD are 41 nm, 59 nm and 77 nm, respectively.

It should be noted that major parts of the tuning curves reside on the semiconductor-cavity (dark shading) resonance lines for SCD and EC designs. In contrast, the tuning curves reside on the air-cavity (light shading) resonance lines for ACD, and we observed the tuning range being largely extended.

Figure 7A:
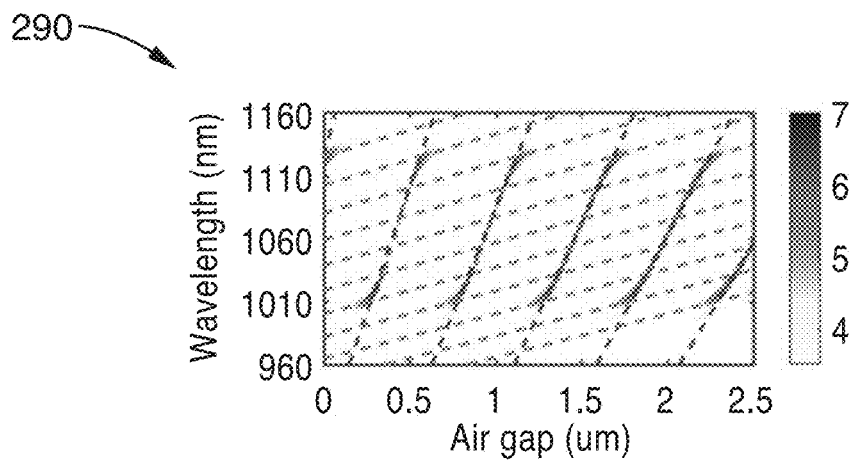
FIG. 7A through FIG. 7C are plots of tuning curves for SCD, EC and ACD VCSELs according to a second configuration of the present disclosure.
Figure 7B:
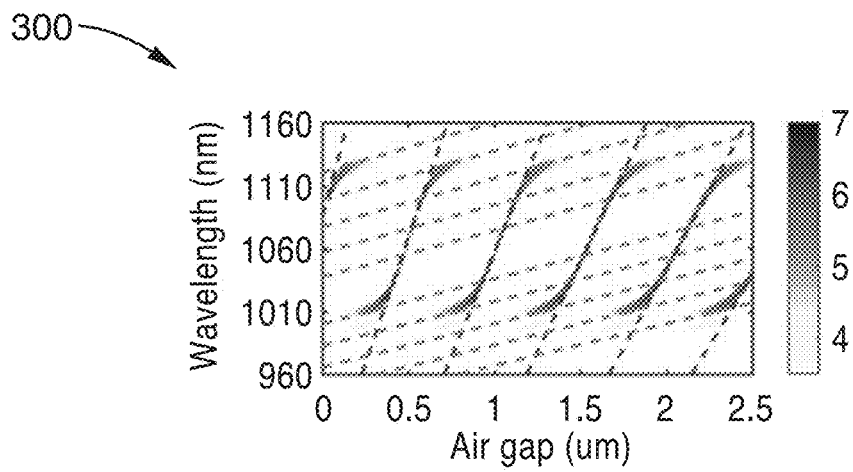
Figure 7C:
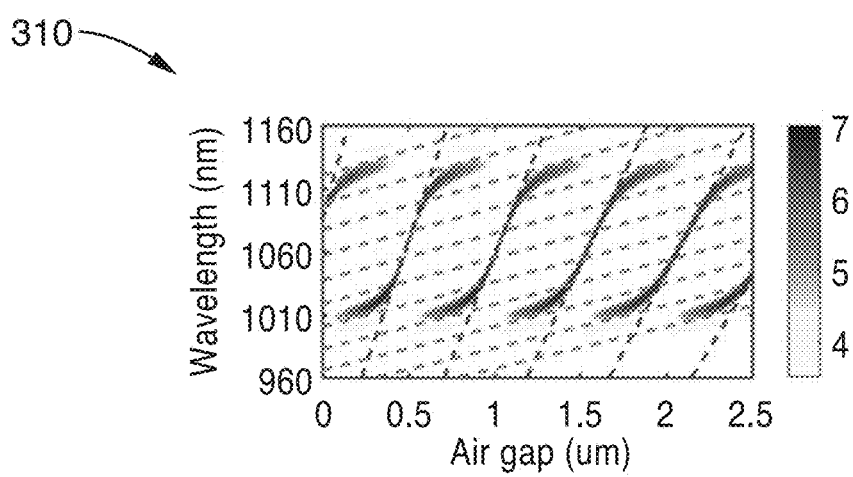

FIG. 7A through FIG. 7C depict results 290, 300, 310 from further investigations on the robustness of the novel ACD designs. The same VCSEL structure was utilized in FIG. 6A through FIG. 6C, including the HCG, except the thickness of the WL, which has an index of 3.483. In this scenario, zero pairs of top DBR were utilized with 33 pairs of bottom DBR. All "High" layers have index of 3.483, and all "Low" layers have index of 2.939. The extracted tuning ranges for WL thicknesses of zero, half-lambda, and one-lambda are 120 nm, 111 nm, and 100 nm respectively. This shows the tuning range being relatively insensitive to the WL thickness of integer multiple of half-lambda. The tuning curves remain S-shape, which indicate that WL thickness of integer multiple of half-lambda does not change the type of design. The more horizontal dashed lines correspond to $L_{eff}$=28 µm and m=approximately 50 to 60. The more vertical dashed lines correspond to $L_{eff}$=2.17 µm and m=approximately 4 to 9.

Figure 8A:
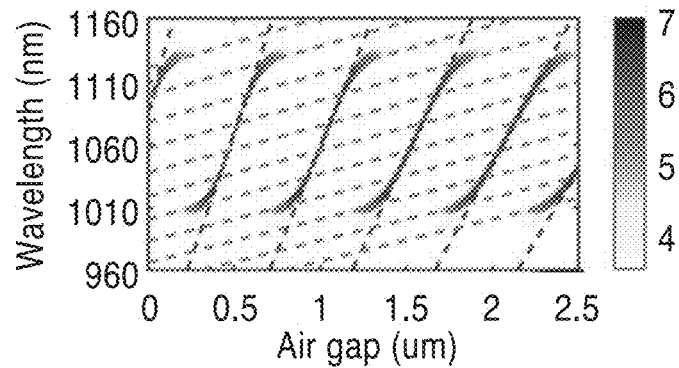
FIG. 8A through FIG. 8C are plots of tuning curves for SCD, EC and ACD VCSELs according to a third configuration of the present disclosure.
Figure 8B:
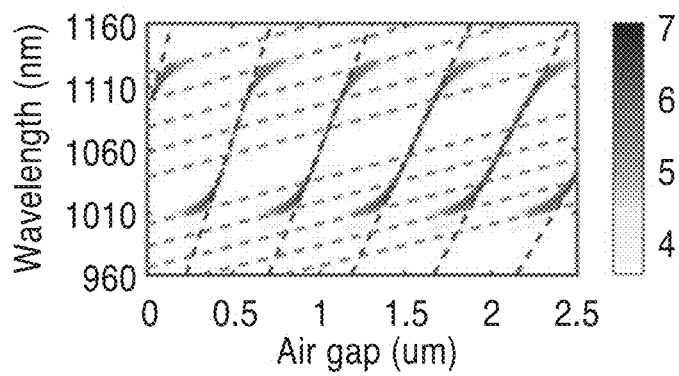
Figure 8C:
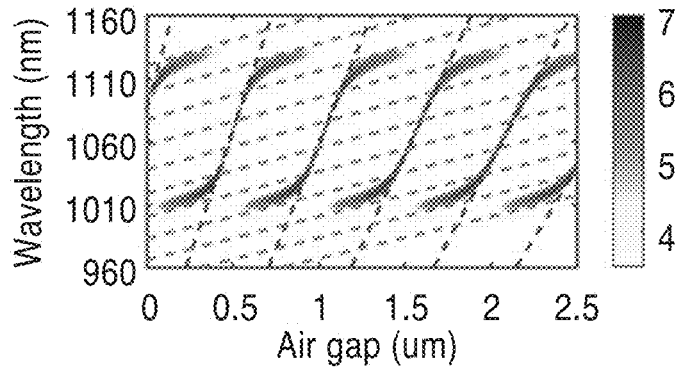

FIG. 8A through FIG. 8C depict results 320, 330, 340 from studying the effect of WL refractive index for ACD designs. The same VCSEL structure was used as in FIG. 7A through FIG. 7C. In this scenario the WL thickness is half-lambda, and the indices are 1.4, 3.483, and 7.5, respectively. The corresponding tuning ranges are 119 nm, 111 nm, and 102 nm, respectively. This shows the tuning range and the shape of the turning curve (S-shape) are insensitive to the WL refractive index. The more horizontal dashed lines and more vertical dashed lines are the same as seen in FIG. 7A through FIG. 7C.

Figure 9A:
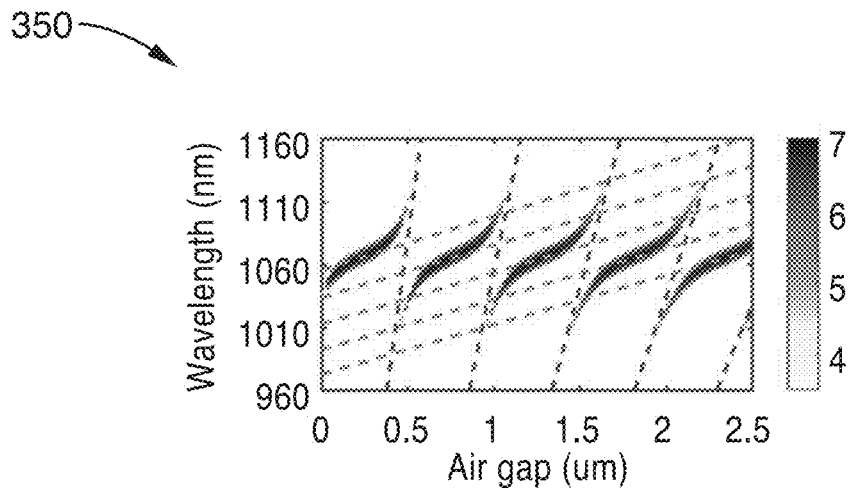
FIG. 9A through FIG. 9C are plots of tuning curves for SCD, EC and ACD VCSELs according to a fourth configuration of the present disclosure.
Figure 9B:
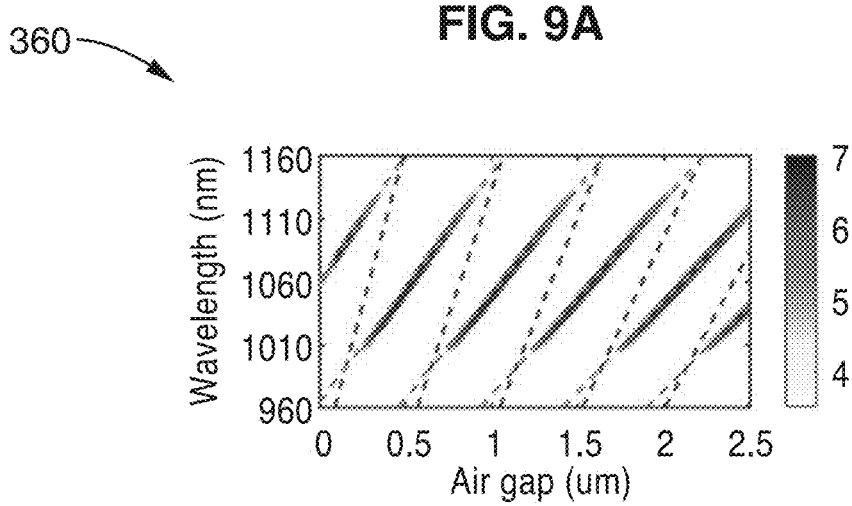
Figure 9C:
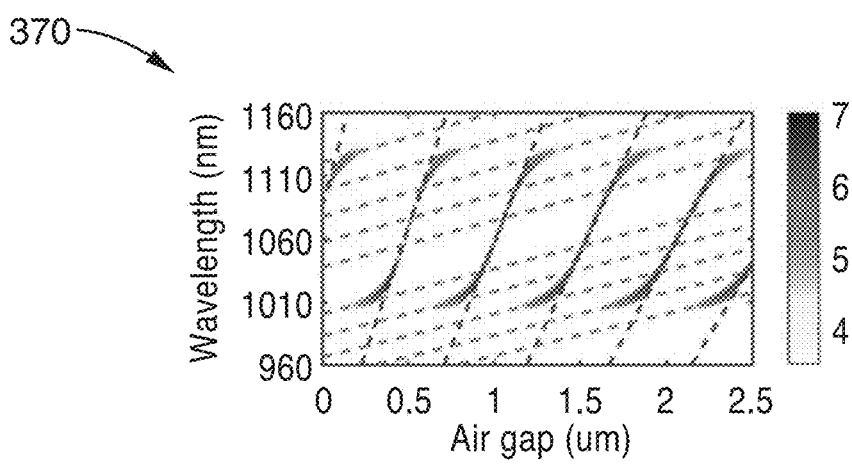

FIG. 9A through FIG. 9C depicts results for SCD 350, ED 360 and ACD 370, demonstrating FDTD simulations for the case of a low-index cavity (schematics shown in FIG. 3A through FIG. 3C). All three cases, the SCD, EC, and ACD configurations exhibit the same tuning characteristics. Here, the cavity regions for all cases are half-lambda thick with indices of 2.939. The same TM-HCGs are used as in FIG. 6A through FIG. 8C. Half pairs of top DBR and 33 pairs of bottom DBRs are used. All "High" layers have index of 3.483, and all "Low" layers have index of 2.939. The WL thickness is zero for SCD, and half-lambda for ACD. Therefore the only difference between SCD and ACD in this case is the thickness (one quarter-lambda versus one half-lambda) of the topmost high-index layer before air gap. We further identified two sets of resonance lines from the asymptotic lines of the tuning curves from FIG. 9A through FIG. 9C.

In FIG. 9A the more vertical dashed lines for SCD correspond to $L_{eff}$=0.58 µm and m=approximately 2 to 6. The more horizontal dashed lines for SCD correspond to $L_{eff}$=24.8 µm and m=approximately 47 to 51. The more vertical dashed lines indicate air-cavity resonance with small field penetration depth into the semiconductor. The more horizontal dashed lines indicate semiconductor-cavity resonance, thus the field penetrates much deeper into the semiconductor region.

Similarly, FIG. 9B shows the more vertical dashed lines for EC correspond to $L_{eff}$=1.83 µm and m=approximately 4 to 9. The more horizontal dashed lines for EC correspond to $L_{eff}$=5.3 µm and m=approximately 10 to 15.

As shown in FIG. 9C, the more vertical dashed lines for ACD correspond to $L_{eff}$=2.17 µm and m=approximately 4 to 9. The more horizontal dashed lines for ACD correspond to $L_{eff}$=28 µm and m=approximately 50 to 60. The extracted tuning ranges for the SCD, EC, and ACD are 55 nm, 87 nm and 112 nm, respectively.

Figure 10A:
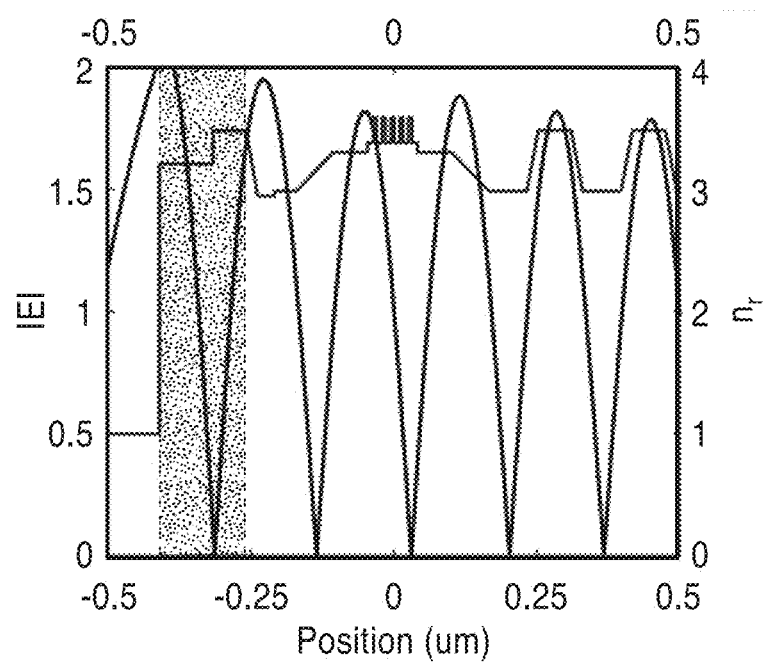
FIG. 10A through FIG. 10C are plots of field peak location shifting at corresponding resonance conditions for SCD, EC and ACD VCSELs according to embodiments of the present disclosure.
Figure 10B:
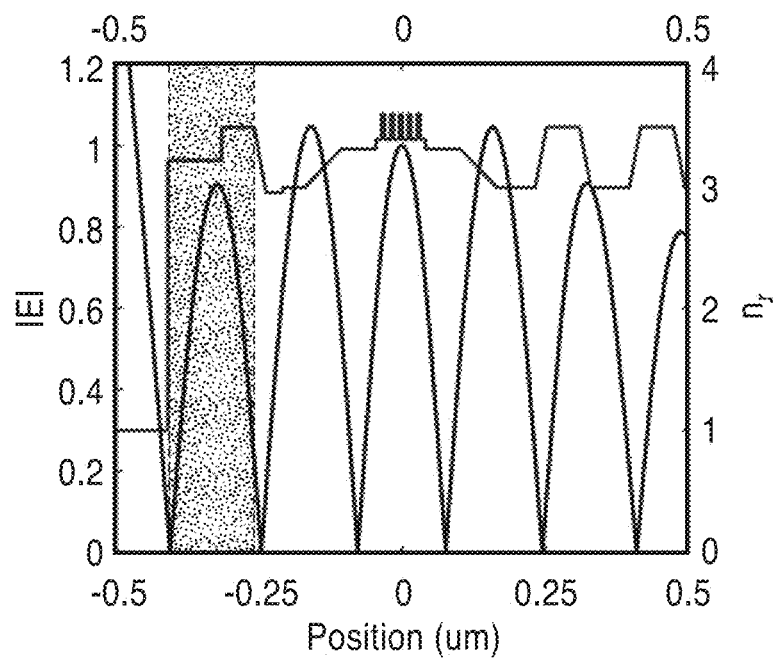
Figure 10C:
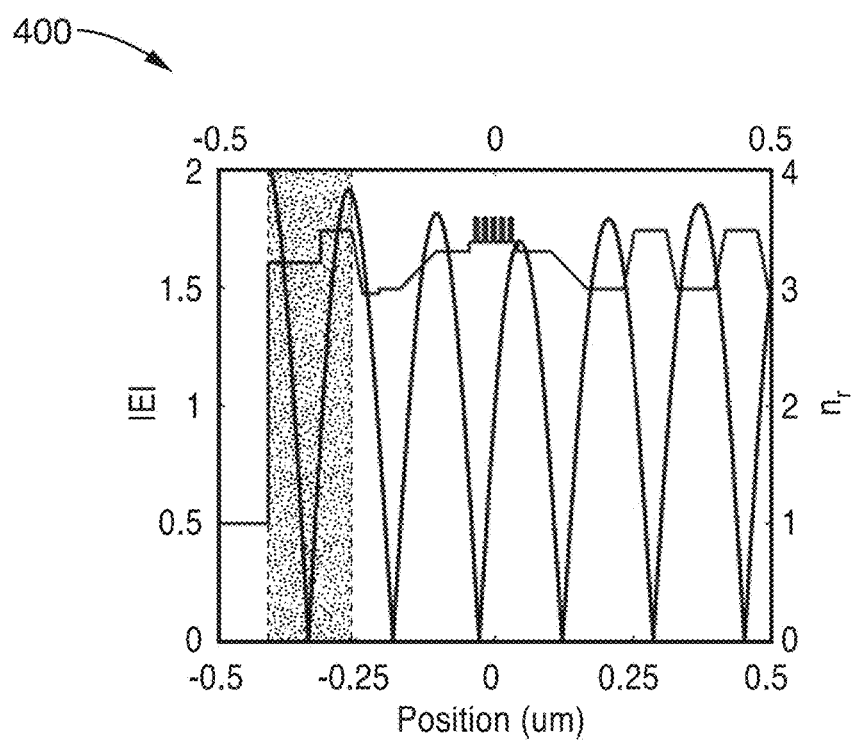

FIG. 10A through FIG. 10C depict results 380, 390, 400 of the shifting of the field peak location at corresponding resonance conditions for a given tunable VCSEL at different air gap thicknesses. The figures illustrate longitudinal field distributions in the cavity region for an ACD VCSEL with air gap thicknesses of 1280 nm (FIG. 10A), 1010 nm (FIG. 10B), and 760 nm (FIG. 10C), with resonance wavelengths being 1112 nm (FIG. 10A), 1057 nm (FIG. 10B), and 1016 nm (FIG. 10C), respectively. At the long-wavelength (short-wavelength) side of the tuning range, the field overlaps more with the QW farther from (closer to) the substrate. Knowing this, we can use different QW thickness and composition to improve the gain for the specific wavelengths. In particular, QWs may be designed with shorter wavelength (higher quantization energy) closer to the substrate and longer wavelength (lower quantization energy) farther from the substrate, to facilitate a larger overlap more with the optical field as the air gap is varied. Therefore we will use larger (smaller) thickness for the QWs which are farther away (closer to) the substrate. Alternatively we can chirp the QW composition. For example, we will use higher (lower) Indium composition in the InGaAs QW which is farther away (closer to) the substrate.

Figure 11A:
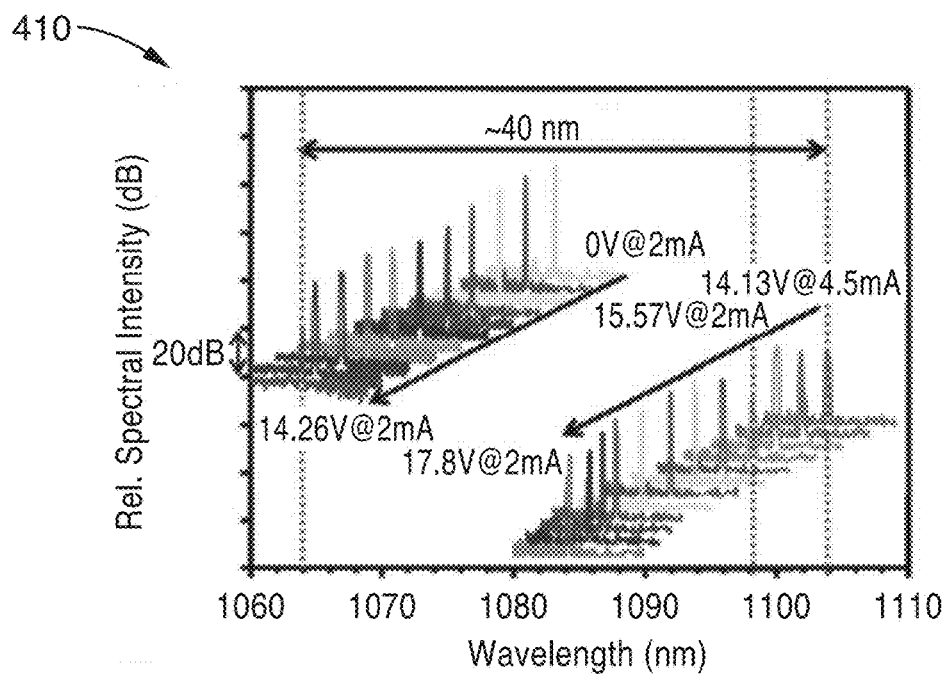
FIG. 11A and FIG. 11B are waveforms of tuning range improvements for the ACD VCSEL design according to an embodiment of the present disclosure.
Figure 11B:
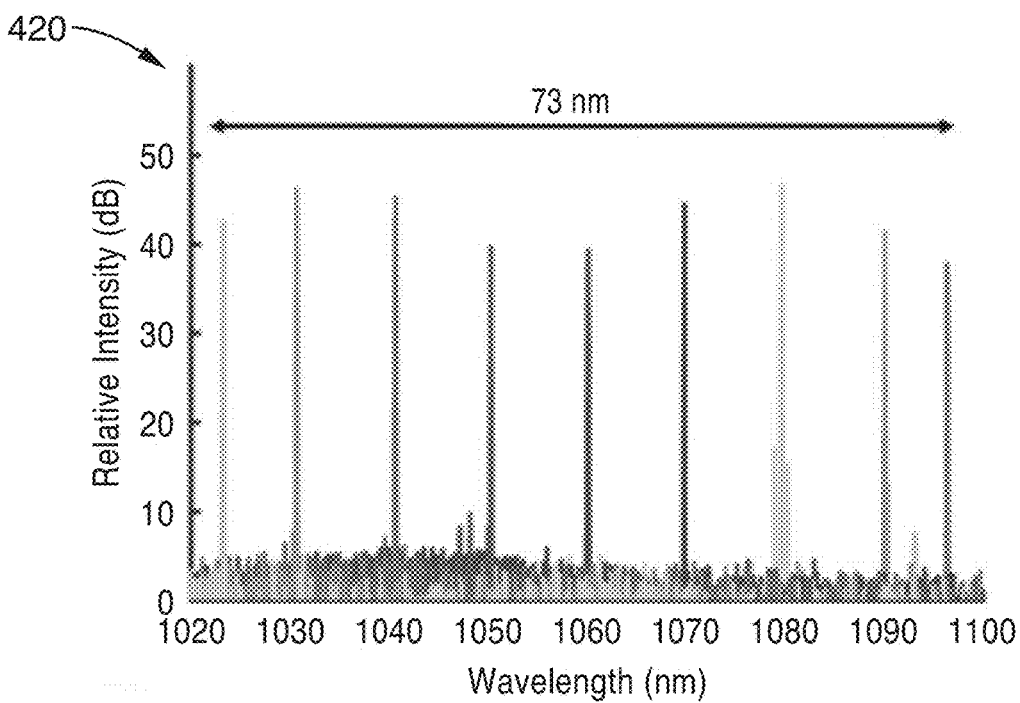
Figure 12A:
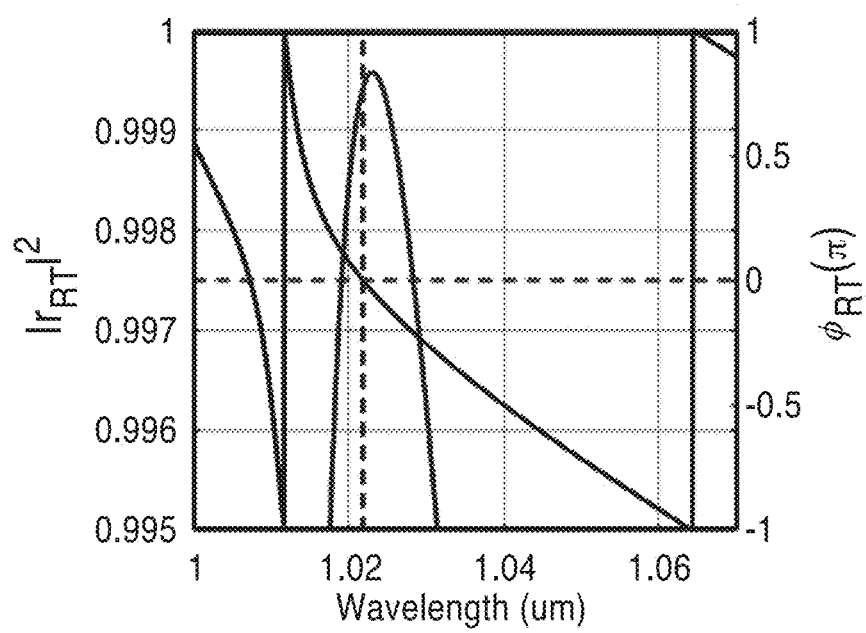
FIG. 12A through FIG. 12D are plots of changing reflection phase of the hybrid top mirror according to an embodiment of the present disclosure.
Figure 12B:
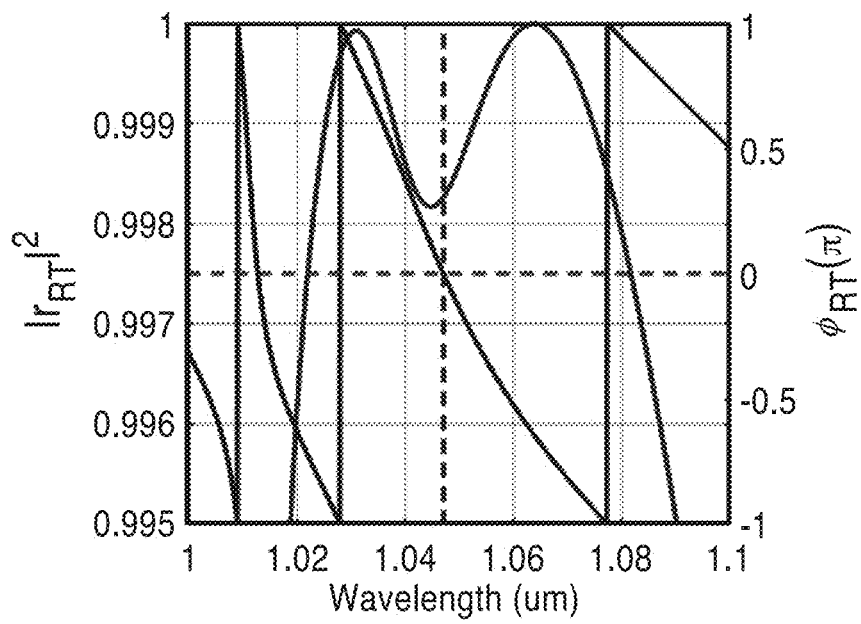
Figure 12C:
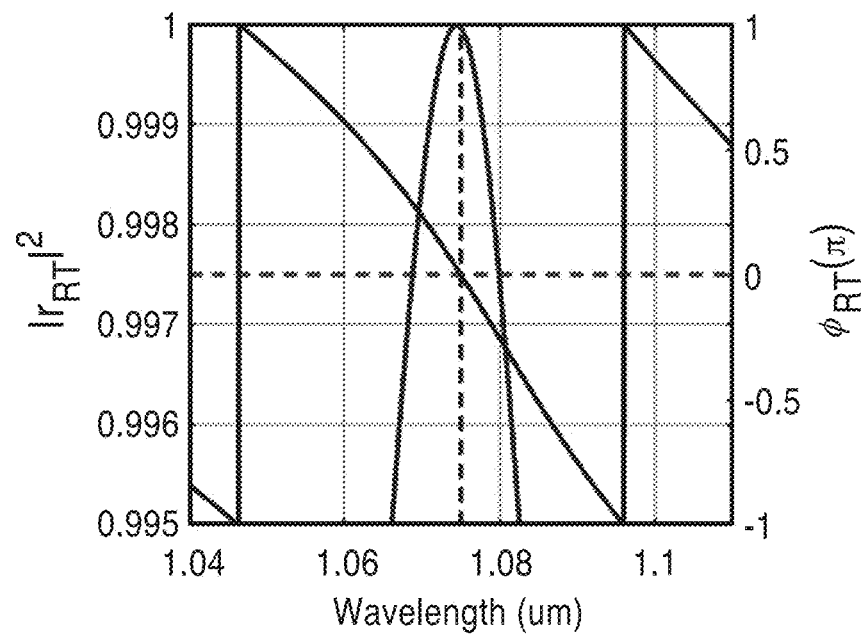
Figure 12D:
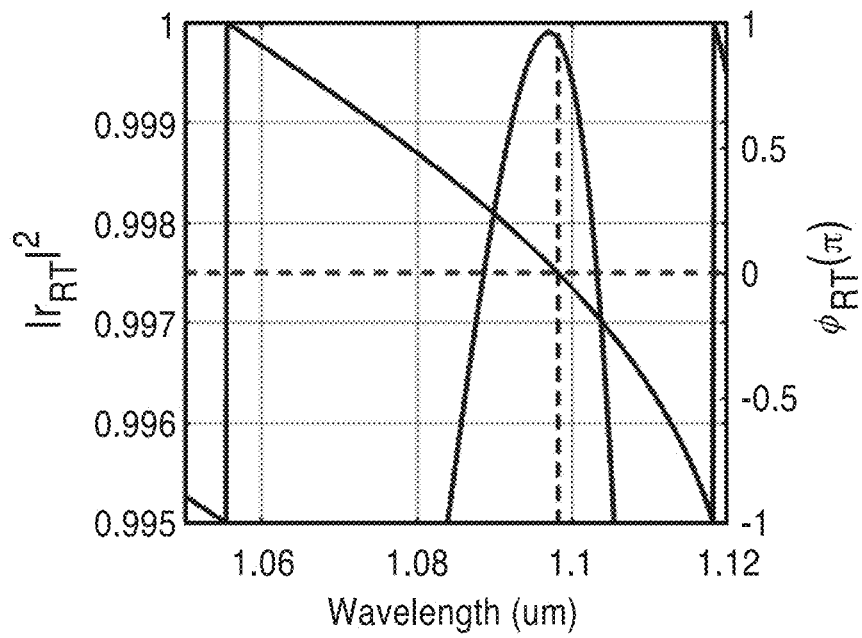

FIG. 11A through FIG. 11B depict results 410, 420 of experimentally significant improvements in VCSEL tuning range by applying our novel ACD design. Our conventional tunable 1060-nm VCSELs using the SCD design exhibited a 40 nm continuous tuning range, as shown in FIG. 11A, which agrees with our prediction in FIG. 6A. By changing the thickness of the SAC region, the SCD design becomes the ACD design, and the experimental tuning range is increased to 73 nm centered at 1060 nm, as shown in FIG. 11B. This leads to what currently appears a record-high relative tuning range of 6.89%, and is by far the largest demonstrated tuning range for electrically-pumped VCSELs that we have seen, while it also confirms the theoretical prediction in FIG. 6C.

FIG. 12A through FIG. 12D depict results 430, 440, 450, 460, of changing the reflection phase of the hybrid top mirror by changing only the lateral parameters (period and duty cycle) of the HCG. In this way, a multi-wavelength VCSEL array is possible on a single chip. Since the ACD design supports a large FSR, short-wave wavelength-division multiplexing (SWDM) is now possible with our novel design. In FIG. 12A through FIG. 12D four designs are shown suitable for 4 channels in SWDM at 1025 nm, 1047 nm, 1075 nm, and 1098 nm. Here we use TE-HCGs with periods ranging from 720 nm to 842 nm and duty cycles ranging from 16% to 34%. The remaining VCSEL structure is the same as in FIG. 7A through FIG. 8C.

C. Notes and Conclusions

1. In this disclosure, the terms "quarter-lambda", "half-lambda", "one-lambda", and so forth for describing layer thicknesses all refer to effective wavelength in the corresponding layer, that is, free-space wavelength divided by the layer refractive index.

2. For one-lambda high-refractive index semiconductor cavity VCSELs, the top DBR preferably comprises integer pairs of low- and high-refractive index quarter-lambda layers, starting with a low-refractive index layer after the cavity, and finishing with a high-refractive index layer on top. The novel ACD design adds a SAC region on top of the top DBR. The SAC region starts with a quarter-lambda low-refractive index layer followed by a half-lambda window layer. The configuration type can also be identified by the shape of the tuning curves, as shown in FIG. 6A through FIG. 6C.

3. Optionally, the high-refractive index semiconductor cavity can be 1.5-lambda or two-lambda. Then the top DBR will comprise a non-negative integer number of pairs of low- to high-refractive index layers, and the SAC region is the same as previous.

4. Optionally, the semiconductor cavity can be low-index. In this case, the top DBR will comprise M+½ pairs of high- and low-refractive index layers, starting with a high-refractive index layer after the semiconductor cavity, and finishing with a high-refractive index layer. After the high-refractive index layer from the DBR, the SAC region design is the same as previous.

5. The thickness of the WL should be an integer multiple of half-lambda. The shapes of the tuning curves, the dominant resonance lines, and the FSRs are all insensitive to the WL thickness, as shown in FIG. 7A through FIG. 7C.

6. The ACD design is very robust in terms of the refractive index for the WL. The shapes of the tuning curves, the dominant resonance lines, and the FSRs are all insensitive to the WL refractive index ranging from 1.4 to 7.5, as shown in FIG. 8A through FIG. 8C.

7. By applying our new ACD design rule to conventional tunable VCSELs using the SCD design, the experimental tuning range increases from 40 nm to 73 nm.

8. In practical designs, intentional thickness variation up to around 20% for a few particular layers will be tolerable, with minimal changes on the tuning range and the type of configuration. For example, in both our SCD and ACD designs (with 40-nm and 73-nm experimental tuning ranges, respectively), the low-index oxidation layers ($Al_{0.98}Ga_{0.02}As$ and $Al_{0.9}Ga_{0.1}As$) above the high-index one-lambda cavity combine to be 0.191-lambda (23.6% deviation from quarter-lambda). In our practical SCD design, there is no WL and topmost "High 1" layer is 0.221-lambda (11.6% deviation from quarter-lambda). In our practical ACD design, the WL is 0.527-lambda (5.4% deviation from half-lambda). The reason for this adjustment is to compensate the deviation of the reflection phase from the HCG from 180 degrees, in order to make the tuning curve symmetric about the tuning center, as shown in FIG. 4.

9. Because of the large FSR provided by our new novel ACD designs, it is now possible to make multi-wavelength VCSEL arrays on a single chip, suitable for SWDM. By way of example and not limitation, we utilize four lateral designs of TE-HCG with a fixed HCG thickness at 633 nm on top of VCSELs with the ACD configuration. The four designs have the same epitaxial structure, and the lateral parameters (HCG periods and duty cycles) are controlled by e-beam lithography. The difference in reflection phase from HCG causes the VCSEL round-trip phases and resonance conditions to be different, while stilling maintaining high round-trip reflectivities (>99.8%), as shown in FIG. 12A through FIG. 12D. The lasing wavelengths for the four channels are 1022 nm, 1047 nm, 1075 nm, and 1098 nm, respectively.

From the description herein, it will be appreciated that that the present disclosure encompasses multiple embodiments which include, but are not limited to, the following:

1. An air-cavity-dominant (ACD) vertical-cavity surface-emitting laser (VCSEL) apparatus, comprising: (a) a top mirror and a semiconductor portion beneath said top mirror and separated from said top mirror by an air-gap; and (b) said semiconductor portion comprising a semiconductor-air coupling (SAC) region, a top distributed Bragg reflector (DBR) beneath said semiconductor-air coupling (SAC) region, a semiconductor cavity containing an active region beneath the top DBR, a bottom DBR beneath said semiconductor cavity, and a substrate beneath said bottom DBR; (c) wherein said SAC region comprises a window layer (WL) followed by a quarter-lambda low-refractive index layer.

2. The apparatus of any preceding embodiment, wherein said window layer (WL) has a thickness of zero.

3. The apparatus of any preceding embodiment, wherein said window layer (WL) has a thickness which is a positive integer multiple of half-lambda.

4. The apparatus of any preceding embodiment, wherein for a one-lambda high-refractive index semiconductor cavity, said top DBR comprises integer pairs of low-refractive index and high-refractive index quarter-lambda layers, starting with a low-refractive index layer above said semiconductor cavity, and finishing with a high-refractive index layer.

5. The apparatus of any preceding embodiment, wherein for a one-lambda, 1.5 lambda, or two-lambda high-refractive index semiconductor cavity, said top DBR comprises a non-negative integer number of pairs of low-refractive index to high-refractive index layers.

6. The apparatus of any preceding embodiment, wherein for a low-index semiconductor cavity, said top DBR comprises M+½ pairs of high-refractive index and low-refractive index layers, starting with a high-refractive index layer after said semiconductor cavity, and finishing with a high-refractive index layer, where M is zero or a positive integer 7. The apparatus of any preceding embodiment, wherein said apparatus has a tuning range of up to about 73 nm.

8. The apparatus of any preceding embodiment, wherein said apparatus is a component of a multi-wavelength VCSEL array on a single chip.

9. The apparatus of any preceding embodiment, wherein said top mirror comprises a high-contrast grating (HCG) or a high contrast metastructure (HCM) which is configured for adjusting reflecting phases.

10. The apparatus of any preceding embodiment, wherein the semiconductor cavity includes one or more QWs as said active region, and wherein said one or more QWs may each have different quantization energies.

11. The apparatus of any preceding embodiment, wherein said QWs are chirped.

12. The apparatus of any preceding embodiment, wherein chirping of said chirped QWs has a direction such that thicker, or thinner, QWs are placed farther away, or closer to, the substrate.

13. The apparatus of any preceding embodiment, wherein said QWs have chirped composition.

14. The apparatus of any preceding embodiment, wherein said QWs comprise InGaAs and wherein there is a higher, or lower, Indium composition in the InGaAs QW which is farther away, or closer to, the substrate.

15. An air-cavity-dominant (ACD) vertical-cavity surface-emitting laser (VCSEL) apparatus, comprising: (a) a top mirror and a semiconductor portion beneath said top mirror and separated from said top mirror by an air-gap; (b) wherein said top mirror comprises a high-contrast grating (HCG) or a high contrast metastructure (HCM) which is configured for adjusting reflecting phases; and (c) said semiconductor portion comprising a semiconductor-air coupling (SAC) region, a top distributed Bragg reflector (DBR) beneath said semiconductor-air coupling (SAC) region, a semiconductor cavity containing an active region beneath the top DBR, a bottom DBR beneath said semiconductor cavity, and a substrate beneath said bottom DBR; (d) wherein said SAC region comprises a window layer (WL) having a thickness of zero or a positive integer multiple of half-lambda, followed by a quarter-lambda low-refractive index layer.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An air-cavity-dominant (ACD) vertical-cavity surface-emitting laser (VCSEL) apparatus, comprising:

a top mirror comprising a high contrast grating (HCG) or high contrast metastructure (HCM), an air gap, and a semiconductor portion of said top mirror beneath said high-contrast grating (HCG) or high contrast metastructure (HCM) and separated from said high-contrast grating (HCG) or high contrast metastructure (HCM) by said air-gap; and wherein said semiconductor portion of said top mirror comprises a semiconductor-air coupling (SAC) region by itself, or over a top distributed Bragg reflector (DBR);

wherein said semiconductor-air coupling (SAC) region comprises a window layer (WL) followed by a quarter-lambda low-refractive index layer, the combination of which increases optical confinement in the air gap at the semiconductor-air interface;

a semiconductor cavity, beneath said top mirror, which contains an active region;

a bottom DBR beneath said semiconductor cavity; and a substrate beneath said bottom DBR.

2. The apparatus of claim 1, wherein said window layer (WL) comprises a high index material.

3. The apparatus of claim 1, wherein said window layer (WL) has a thickness which is a positive integer multiple of half-lambda.

4. The apparatus of claim 1, wherein for a one-lambda high-refractive index semiconductor cavity, said top DBR comprises integer pairs of low-refractive index and high-refractive index quarter-lambda layers, starting with a low-refractive index layer above said semiconductor cavity, and finishing with a high-refractive index layer.

5. The apparatus of claim 1, wherein for a one-lambda, 1.5 lambda, or two-lambda high-refractive index semiconductor cavity, said top DBR comprises a non-negative integer number of pairs of low-refractive index to high-refractive index layers.

6. The apparatus of claim 1, wherein for a low-index semiconductor cavity, said top DBR comprises M+½ pairs of high-refractive index and low-refractive index layers, starting with a high-refractive index layer after said semiconductor cavity, and finishing with a high-refractive index layer, where M is zero or a positive integer.

7. The apparatus of claim 1, wherein said apparatus has a tuning range of up to about 73 nm.

8. The apparatus of claim 1, wherein said apparatus is a component of a multi-wavelength VCSEL array on a single chip.

9. The apparatus of claim 8, wherein said top mirror comprises a high-contrast grating (HCG) or a high contrast metastructure (HCM) which is configured for adjusting reflecting phases.

10. The apparatus of claim 1, wherein the semiconductor cavity includes one or more QWs as said active region, and wherein said one or more QWs may each have different quantization energies.

11. The apparatus of claim 10, wherein said QWs are chirped.

12. The apparatus of claim 11, wherein chirping of said chirped QWs has a direction such that thicker, or thinner, QWs are placed farther away, or closer to, the substrate.

13. The apparatus of claim 10, wherein said QWs comprise InGaAs and wherein there is a higher, or lower, Indium composition in the InGaAs QW which is farther away, or closer to, the substrate.

14. The apparatus of claim 1, wherein said air-cavity-dominant (ACD) design facilitates an increased field confinement in the air gap, and the increased field confinement causes the air gap to be the dominant cavity.

15. An air-cavity-dominant (ACD) vertical-cavity surface-emitting laser (VCSEL) apparatus, comprising:
- a top mirror comprising a high contrast grating (HCG) or high contrast metastructure (HCM), an air gap, and a semiconductor portion of said top mirror beneath said high contrast grating or high contrast metastructure (HCM) and separated from said high contrast grating or high contrast metastructure (HCM) by said air-gap;
- wherein said top mirror comprises a high-contrast grating (HCG) or a high contrast metastructure (HCM) which is configured for adjusting reflecting phases;
- wherein said semiconductor portion of said top mirror comprises a semiconductor-air coupling (SAC) region by itself, or over a top distributed Bragg reflector (DBR);
- wherein said semiconductor-air coupling (SAC) region comprises a window layer (WL) having high refractive index with a thickness of an integer multiple of half-lambda, followed by a quarter-lambda low-refractive index layer, the combination of which increases optical confinement in the air gap at the semiconductor-air interface;
- a semiconductor cavity, beneath said top mirror, which contains an active region;
- a bottom DBR beneath said semiconductor cavity; and
- a substrate beneath said bottom DBR.

16. The apparatus of claim 15 wherein said apparatus is a component of a multi-wavelength VCSEL array on a single chip.

17. The apparatus of claim 15, wherein the semiconductor cavity includes one or more QWs as said active region, and wherein said one or more QWs may each have different quantization energies.

18. The apparatus of claim 17, wherein said QWs are chirped.

19. The apparatus of claim 18, wherein chirping of said chirped QWs has a direction such that thicker, or thinner, QWs are placed farther away, or closer to, the substrate.

20. The apparatus of claim 18, wherein said QWs comprise InGaAs and wherein there is a higher, or lower, Indium composition in the InGaAs QW which is farther away, or closer to, the substrate.

* * * * *